(12) United States Patent  
Ishizaka et al.

(10) Patent No.: US 8,716,132 B2
(45) Date of Patent: May 6, 2014

(54) RADIATION-ASSISTED SELECTIVE DEPOSITION OF METAL-CONTAINING CAP LAYERS

(75) Inventors: Tadahiro Ishizaka, Watervliet, NY (US); Shigeru Mizuno, Delmar, NY (US)

(73) Assignee: Tokyo Electron Limited, Tokyo (JP)

( * ) Notice: Subject to any disclaimer, the term of this patent is extended or adjusted under 35 U.S.C. 154(b) by 598 days.

(21) Appl. No.: 12/371,411

(22) Filed: Feb. 13, 2009

(65) Prior Publication Data

US 2010/0210108 A1   Aug. 19, 2010

(51) Int. Cl.
*H01L 21/3205* (2006.01)

(52) U.S. Cl.
USPC ........... 438/674; 438/685; 438/686; 438/795; 257/E21.295

(58) Field of Classification Search
USPC .................................. 438/650, 680, 686, 674
See application file for complete search history.

(56) References Cited

U.S. PATENT DOCUMENTS

| | | | |
|---|---|---|---|
| 4,851,895 A | 7/1989 | Green et al. | |
| 4,871,416 A * | 10/1989 | Fukuda | 438/708 |
| 4,929,468 A | 5/1990 | Mullendore | |
| 4,938,999 A | 7/1990 | Jenkin | |
| 5,171,610 A | 12/1992 | Liu | |
| 5,372,849 A | 12/1994 | McCormick et al. | |
| 6,063,705 A | 5/2000 | Vaartstra | |
| 6,074,945 A | 6/2000 | Vaartstra et al. | |
| 6,303,809 B1 | 10/2001 | Chi et al. | |
| 6,319,832 B1 | 11/2001 | Uhlenbrock et al. | |
| 6,420,583 B1 | 7/2002 | Lienhard et al. | |
| 6,440,495 B1 | 8/2002 | Wade et al. | |
| 6,444,263 B1 | 9/2002 | Paranjpe et al. | |
| 6,605,735 B2 | 8/2003 | Kawano et al. | |
| 6,713,373 B1 | 3/2004 | Omstead | |
| 6,844,258 B1 * | 1/2005 | Fair et al. | 438/648 |
| 6,989,321 B2 | 1/2006 | Yamasaki et al. | |
| 7,107,998 B2 | 9/2006 | Greer et al. | |
| 7,264,846 B2 | 9/2007 | Chang et al. | |
| 7,270,848 B2 | 9/2007 | Suzuki et al. | |

(Continued)

FOREIGN PATENT DOCUMENTS

CA  2206217       11/1998
EP  0620291 A1    10/1994

(Continued)

OTHER PUBLICATIONS

Shacham-Diamond, "Barrier Layers Technology" 2005, Tel-Aviv University, source: www.eng.tau.ac.il/~yosish/courses/vlsi/dbl-copper.ppt , pp. 1-60.*

(Continued)

*Primary Examiner* — Angel Roman

(57) ABSTRACT

A method for integrating metal-containing cap layers into copper (Cu) metallization of semiconductor devices to improve electromigration and stress migration in bulk Cu metal. In one embodiment, the method includes providing a patterned substrate containing Cu metal surfaces and dielectric layer surfaces, exposing the patterned substrate to a process gas comprising a metal-containing precursor, and irradiating the patterned substrate with electromagnetic radiation, where selective metal-containing cap layer formation on the Cu metal surfaces is facilitated by the electromagnetic radiation. In some embodiments, the method further includes pre-treating the patterned substrate with additional electromagnetic radiation and optionally a cleaning gas prior to forming the metal-containing cap layer.

20 Claims, 10 Drawing Sheets

(56) References Cited

U.S. PATENT DOCUMENTS

| | | |
|---|---|---|
| 7,279,421 B2 | 10/2007 | Suzuki |
| 7,285,308 B2 | 10/2007 | Hendrix et al. |
| 7,459,396 B2 | 12/2008 | Suzuki et al. |
| 2003/0129306 A1 | 7/2003 | Wade et al. |
| 2005/0078462 A1* | 4/2005 | Dando et al. ............... 361/783 |
| 2005/0110142 A1 | 5/2005 | Lane et al. |
| 2006/0113675 A1 | 6/2006 | Chang et al. |
| 2006/0121733 A1 | 6/2006 | Kilpela et al. |
| 2006/0131751 A1 | 6/2006 | Minamihaba |
| 2006/0199372 A1 | 9/2006 | Chung et al. |
| 2006/0273431 A1 | 12/2006 | He et al. |
| 2007/0059502 A1 | 3/2007 | Wang et al. |
| 2007/0161217 A1* | 7/2007 | Salinas et al. ............... 438/514 |
| 2007/0218704 A1* | 9/2007 | Ishizaka et al. ............. 438/778 |
| 2007/0256925 A1* | 11/2007 | Yasui et al. ............... 204/192.1 |
| 2007/0284736 A1 | 12/2007 | Yang et al. |
| 2009/0065939 A1 | 3/2009 | Suzuki |
| 2009/0186481 A1 | 7/2009 | Suzuki |

FOREIGN PATENT DOCUMENTS

| | | |
|---|---|---|
| JP | 2004146516 | 5/2004 |
| WO | WO 00/12777 | 3/2000 |
| WO | WO0026432 A1 | 5/2000 |
| WO | WO2005034223 A1 | 4/2005 |
| WO | 2006104853 | 10/2006 |

OTHER PUBLICATIONS

Czekaj, C., et al. Inorganic Chemistry, 1988, 27, p. 8-10.

Wang et al., Low-temperature chemical vapor deposition and scaling limit of ultrathin Ru films, Applied Physics Letters, Feb. 23, 2004, p. 1380-1382, vol. 84, No. 8, American Institute of Physics, Melville, NY.

Boyd, Edwin P., et al., "Chemical Vapor Deposition of Metallic Thin Films Using Homonuclear and Heteronuclear Metal Carbonyls", Chem. Mater. 1997, 9, pp. 1154-1158.

Green, M.L., et al., "Chemical Vapor Deposition of Ruthenium and Ruthenium Dioxide Films", Journal of the Electrochemical Society, vol. 132, No. 11, pp. 2677-2685.

Cheng, Wei-Yuan, et al., "Initial growth of chemical-vapor-deposited Ru from bis(hexafluoroacetylacetonate)dicarbonyl ruthenium", Thin Solid Films 483 (2005) pp. 31-37.

Gatineau, Julien, et al., "Deposition of highly pure ruthenium thin films with a new metal-organic precursor", Surface and Coatings Technology 201 (2007), pp. 9146-9148.

Bykov, A.F., et al., "Investigation of Thermal Properties of Ruthenium(III) B-Diketonate Precursors for Preparation of RuO2 Films by CVD", Journal of Thermal Analysis, vol. 46 (1996) pp. 1551-1565.

U.S. Appl. No. 12/173,814, Suzuki et al., Method for Forming a Ruthenium Metal Cap Layer.

U.S. Appl. No. 12/240,894, Ishizaka et al., Method for Forming Ruthenium Metal Cap Layers.

* cited by examiner

RADIATION-ASSISTED SELECTIVE DEPOSITION OF METAL-CONTAINING CAP LAYERS

FIELD OF THE INVENTION

The present invention relates to semiconductor processing and semiconductor devices, and more particularly, to a method of integrating metal-containing cap layers into copper(Cu) metallization of semiconductor devices to improve electromigration and stress migration in bulk Cu metal.

BACKGROUND OF THE INVENTION

An integrated circuit contains various semiconductor devices and a plurality of conducting metal paths that provide electrical power to the semiconductor devices and allow these semiconductor devices to share and exchange information. Within the integrated circuit, metal layers are stacked on top of one another using intermetal or interlayer dielectric layers that insulate the metal layers from each other. Normally, each metal layer must form an electrical contact to at least one additional metal layer. Such electrical contact is achieved by etching a hole (i.e., a via) in the interlayer dielectric that separates the metal layers, and filling the resulting via with a metal to create an interconnect. A "via" normally refers to any recessed feature such as a hole, line or other similar feature formed within a dielectric layer that, when filled with metal, provides an electrical connection through the dielectric layer to a conductive layer underlying the dielectric layer. Similarly, recessed features connecting two or more vias are normally referred to as trenches.

The use of Cu metal in multilayer metallization schemes for manufacturing integrated circuits has created several problems that require solutions. For example, high mobility of Cu atoms in dielectric materials and Si can result in migration of Cu atoms into those materials, thereby forming electrical defects that can destroy an integrated circuit. Therefore, Cu metal layers, Cu filled trenches, and Cu filled vias are normally encapsulated with a barrier layer to prevent Cu atoms from diffusing into the dielectric materials. Barrier layers are normally deposited on trench and via sidewalls and bottoms prior to Cu deposition, and may include materials that are preferably non-reactive and immiscible in Cu, provide good adhesion to the dielectrics materials and can offer low electrical resistivity.

The electrical current density in an integrated circuit's interconnects significantly increases for each successive technology node due to decreasing minimum feature sizes. Because electromigration and stress migration lifetimes are inversely proportional to current density, electromigration and stress migration have fast become critical challenges. Electromigration lifetime in Cu dual damascene interconnect structures is strongly dependent on atomic Cu transport at the interfaces of bulk Cu metal and surrounding materials which is directly correlated to adhesion at these interfaces. New materials that provide better adhesion and better electromigration lifetimes have been studied extensively. For example, a cobalt-tungsten-phosphorus (CoWP) layer has been selectively deposited on bulk Cu metal using an electroless plating technique. The interface of CoWP and bulk Cu metal has superior adhesion strength that yields longer electromigration lifetime. However, maintaining acceptable deposition selectivity on bulk Cu metal, especially for tight pitch Cu wiring, and maintaining good film uniformity, has affected acceptance of this complex process. Furthermore, wet process steps using acidic solution may be detrimental to the use of CoWP.

Therefore, new methods are required for depositing metal-containing cap layers that provide good adhesion to Cu metal and improved electromigration and stress migration properties of bulk Cu metal. In particular, these methods should provide good selectivity for forming the metal-containing cap layers on Cu surfaces compared to dielectric surfaces.

SUMMARY OF THE INVENTION

Embodiments of the invention provide a method for forming metal-containing cap layers on patterned substrates, where the metal-containing cap layers are selectively on Cu metal surfaces relative to on dielectric layer surfaces. According to some embodiments, the metal-containing cap layer can contain ruthenium (Ru), cobalt (Co), molybdenum (Mo), tungsten (W), platinum (Pt), iridium (Ir), rhodium (Rh), or rhenium (Re), or a combination of two or more thereof. According to other embodiments, the metal-containing cap layer can contain oxides, nitrides, borides, or phosphides of Ru, Co, Mo, W, Pt, Ir, Rh, or Re, or a combination thereof.

According to one embodiment of the invention, the method includes providing a patterned substrate containing Cu metal surfaces and dielectric layer surfaces; exposing the patterned substrate to a process gas comprising a metal-containing precursor; and irradiating the patterned substrate with electromagnetic radiation, where selective metal-containing cap layer formation on the Cu metal surfaces is facilitated by the electromagnetic (EM) radiation. According to another embodiment of the invention, the method further includes, pre-treating the patterned substrate with additional electromagnetic radiation and optionally a cleaning gas prior to forming the metal-containing cap layer.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF SEVERAL EMBODIMENTS

Embodiments of the invention provide methods for integrating metal-containing cap layers into Cu metallization of semiconductor devices to improve electromigration and stress migration in the devices. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Furthermore, it is understood that the various embodiments shown in the figures are illustrative representations and are not necessary drawn to scale.

Figure 1A:
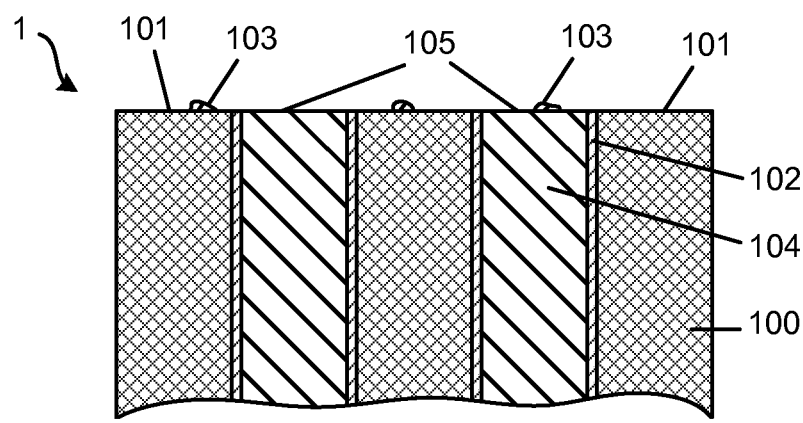
FIGS. 1A-1G show schematic cross-sectional views of formation of metal-containing cap layers in Cu metallization of a semiconductor device according to some embodiments of the invention.

FIGS. 1A-1F show schematic cross-sectional views of formation of metal-containing cap layers in Cu metallization of a semiconductor device according to some embodiments of the invention. FIG. 1A shows a patterned substrate 1 containing a plurality of recessed features in a dielectric layer 100, a diffusion barrier layer 102 on the sidewalls of the recessed features, and Cu metal layers 104 filling the recessed features. The dielectric layer 100 can, for example, contain $SiO_2$, a low dielectric constant (low-k) dielectric material such as fluorinated silicon glass (FSG), carbon doped oxide, a polymer, a SiCOH or SiCOH-containing low-k material, a non-porous low-k material, a porous low-k material, a CVD low-k material, a spin-on dielectric (SOD) low-k material, or any other suitable dielectric material, including high dielectric constant (high-k) dielectric materials. The diffusion barrier layer 102 can, for example, contain a tantalum (Ta)-containing layer (e.g., Ta, TaC, TaN, or TaCN, or a combination thereof), a titanium (Ti)-containing layer (e.g., Ti, TiN, or a combination thereof), or a tungsten (W)-containing layer (e.g., W, WN, or a combination thereof). According to one embodiment of the invention, the diffusion barrier layer 102 may further contain an adhesion layer, e.g., a Ru metal layer, in direct contact with the Cu metal layers 104 in the recessed features.

Cu filling of the recessed features may be performed by a Cu plating process, for example by an electrochemical plating process or by an electroless plating process, and the planarization may be performed by chemical mechanical polishing (CMP) following the Cu plating process. The CMP process may be optimized for Cu removal with high selectivity to the dielectric layer 100. The planarization removes excess Cu metal from the patterned substrate following the Cu filling process and further removes the diffusion barrier layer 102 from the dielectric layer surfaces 101. CMP and Cu plating processes are well known to those skilled in the art. The patterned substrate 1 shown in FIG. 1A has been planarized to form Cu metal surfaces 105 and dielectric layer surfaces 101.

According to one embodiment of the invention, prior to a Cu planarization process, the patterned substrate may be heat-treated at a substrate temperature between 150° C. and 400° C. in the presence of a treatment gas. The treatment gas can contain $H_2$, $N_2$, or $NH_3$, or a combination thereof, and optionally an inert gas such as a noble gas (e.g., Ar). The heat-treating aids in crystallization of the Cu metal layers 104 which lowers the electrical resistivity of the Cu metal layers 104.

In FIG. 1A, the patterned substrate 1 may be a part of a damascene interconnect structure containing high-aspect-ratio recessed features in the dielectric layer 100. The features can have an aspect ratio (depth/width) greater than or equal to about 2:1, for example 3:1, 4:1, 5:1, 6:1, 12:1, 15:1, or higher. The features can have a width of about 200 nanometers (nm=$10^{-9}$m), or less, for example 150 nm, 100 nm, 65 nm, 45 nm, 32 nm, 20 nm, or smaller. However, embodiments of the invention are not limited to these aspect ratios or feature widths, as other aspect ratios and feature widths may be utilized. According to one embodiment of the invention, a dual damascene interconnect structure contains a trench and a via formed in the patterned substrate 1. It will be understood that embodiments of the invention may be applied to simple and complicated damascene interconnect structures and other types of patterned substrates containing recessed features filled with Cu metal.

Embodiments of the invention provide methods for improving selectivity when forming metal-containing cap layers for Cu metallization of semiconductor devices. Still referring to FIG. 1A, the presence of metal-containing cap layers on the Cu metal surfaces 105 is extremely beneficial to the electromigration and stress migration properties of the Cu metal layers 104. However, the presence of even minute amounts of additional metal-containing materials on the dielectric layer surfaces 101 can be detrimental to the various electrical properties of the semiconductor device. As the minimum feature sizes of semiconductor devices decrease and the thickness of the dielectric layer 100 between adjacent Cu metal layers 104 decreases, these problems become increasingly more serious. In one example, a 32 nm minimum feature size device generation may utilize only about 45-50 nm dielectric thickness between adjacent Cu metal layers 104, and minute amounts of additional metal-containing material on the dielectric layer surfaces 101 can create a current leakage path between the adjacent Cu metal layers 104, and strongly effect current (I)—voltage (V) and time-dependent-dielectric-breakdown (TDDB) behavior of the semiconductor device.

As shown in FIG. 1A, contaminants 103 may be present on the patterned substrate 1. The contaminants 103 may include organic residues on the Cu metal surfaces 105 and on the dielectric layer surfaces 101. Organic residues may include benzotriazine (BTA) that is a chemical agent commonly used in a CMP process. The contaminants 103 may further include a thin layer of oxidized copper on the Cu metal surfaces 105 and minute amounts of Cu metal or oxidized copper on the dielectric layer surfaces 101. The contaminants 103 can affect selective deposition of metal-containing cap layers on the Cu metal surfaces 105 and should therefore be removed from the patterned substrate 1. In particular, the contaminants 103 can block adsorption sites for metal-containing precursors on the Cu metal surfaces 105 and can provide unwanted adsorption sites for metal-containing precursors on the dielectric layer surfaces 101. In addition, the presence of hydroxyl (—OH) groups on the dielectric layer surfaces 101 can provide unwanted adsorption sites for metal-containing precursors and result in loss of selectivity during deposition of metal-containing cap layers on the Cu metal surfaces 105. As used herein, loss of selectivity refers to unwanted deposition of a metal-containing material on the dielectric layer surfaces 101.

FIGS. 2A-2E schematically show gas and electromagnetic radiation exposures during formation of metal-containing cap layers in Cu metallization of a semiconductor device according to some embodiments of the invention.

Figure 1B:
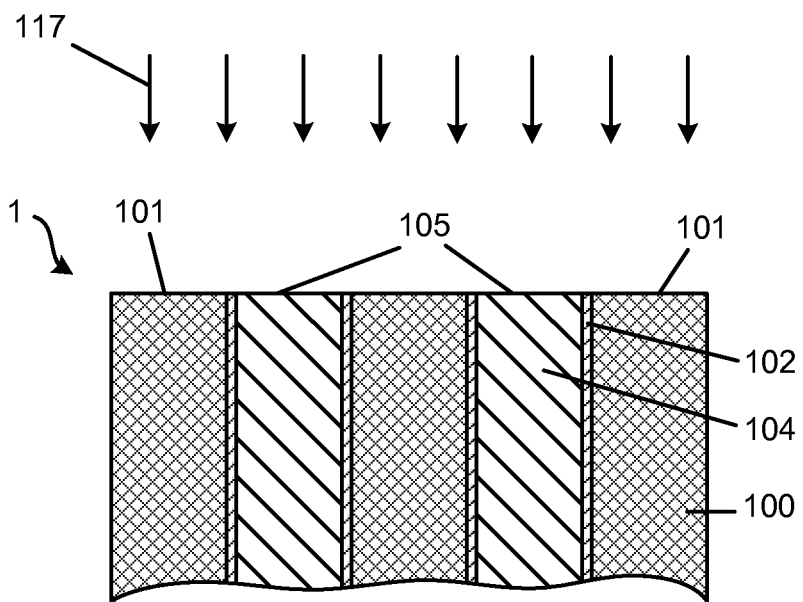
Figure 2A:
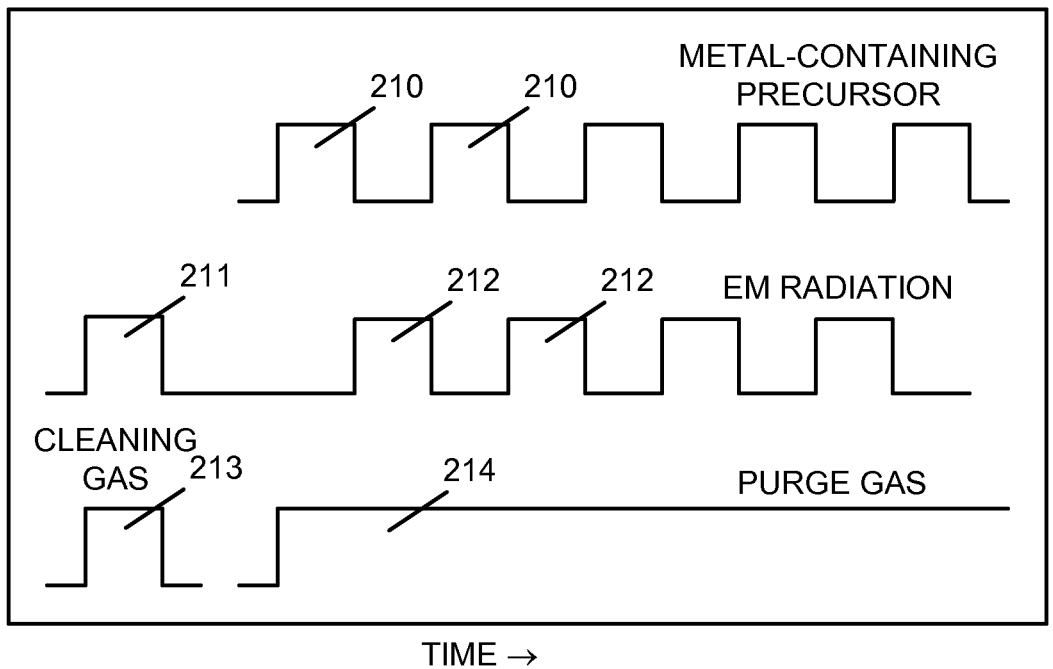
FIGS. 2A-2F schematically show gas and electromagnetic radiation exposures during formation of metal-containing cap layers according to some embodiments of the invention.

Referring now to FIG. 1B and FIG. 2A, according to one embodiment of the invention, the patterned substrate 1 may be pre-treated by irradiating the patterned substrate 1 with a pulse 211 of electromagnetic (EM) radiation 117 and optionally a pulse 213 of a cleaning gas prior to formation of metal-containing cap layers on the Cu metal surfaces 105. The pre-treating may be carried out to remove the contaminants 103 depicted in FIG. 1A from the patterned substrate 1. Furthermore, the pre-treating can be performed to remove hydroxyl groups from the dielectric layer surfaces 101 and to remove oxidized copper from the Cu metal surfaces 105. The cleaning gas can be selected from inert gases (e.g., He, Ar, $N_2$), reactive gases (e.g., $H_2$, $NH_3$), or a combination thereof. According to other embodiments, the pre-treating may be omitted or performed using other means. For example, the pre-treating may be performed by exposing the patterned substrate 1 to a thermally excited or plasma excited reactive gas (e.g., $H_2$, $NH_3$) without the use of EM radiation.

According to some embodiments of the invention, the EM radiation 117 can include radiant energy in the form of photons, including, in the order of decreasing energy, gamma radiation, X-rays, ultraviolet radiation (UV), visible light, infrared energy, microwave radiation, and radio waves. According to some embodiments of the invention, the EM radiation 117 may contain single-frequency or multi-frequency EM radiation with frequencies corresponding to wavelengths less than about 500 nm. However, frequencies corresponding to wavelength greater than about 500 nm may also be used. According to one embodiment of the invention, the EM radiation 117 can include wavelengths between about 500 nm and about 125 nm. Examples of EM radiation sources that can be employed to generate components of the single frequency or multi-frequency ultra-violet electromagnetic radiation include $Xe_2$ (172 nm), KrCl (222 nm), KrF (248 nm), $F_2$ (157 nm), ArF (193 nm), XeCl (308 nm), or XeF (351 nm) excimer lamps. According to one embodiment of the invention, the EM radiation 117 can contain diffuse radiation that is nearly isotropic (i.e., not strongly directional). According to another embodiment of the invention, the EM radiation 117 can contain collimated radiation, i.e., radiation in which all electromagnetic rays from the radiation source are substantially parallel to each other.

Figure 1C:
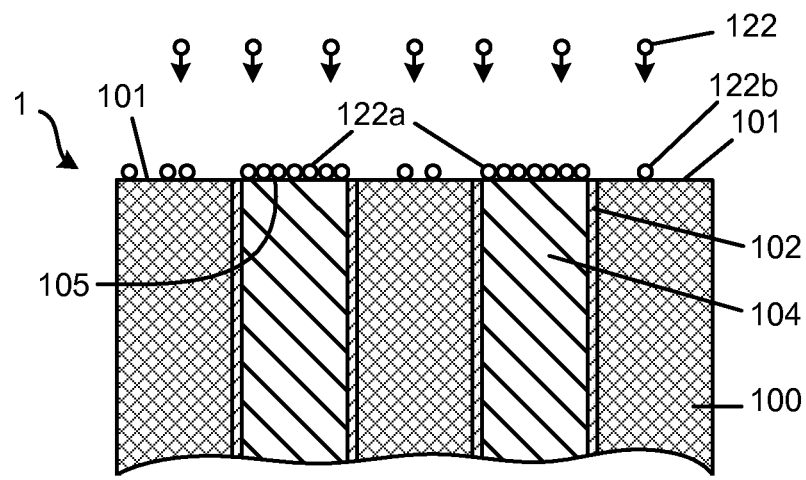

Still referring to FIG. 2A, following the optional pre-treating step, the patterned substrate 1 is exposed to a gas pulse 210 containing a metal-containing precursor and optionally a flow 214 of a purge gas. The purge gas can, for example, contain an inert gas (e.g., Ar, $N_2$). FIG. 1C schematically shows exposure of a metal-containing precursor 122 to the patterned substrate 1. The exposure of the patterned substrate 1 to the metal-containing precursor 122 adsorbs metal-containing precursor species 122a on the Cu metal surfaces 105 and metal-containing precursor species 122b on the dielectric layer surfaces 101. As depicted in FIG. 1C, it is believed that the surface concentration of the metal-containing precursors species 122a adsorbed on the Cu metal surfaces 105 is greater than the surface concentration of the metal-containing precursor species 122b adsorbed on the dielectric layer surfaces 101. This is due to a greater number of adsorption sites for the metal-containing precursor 122 on the Cu metal surfaces 105 than on the dielectric layer surfaces 101.

The metal-containing precursor species 122a are chemisorbed on the Cu metal surfaces 105 but the metal-containing precursor species 122b are more weakly physisorbed on the dielectric layer surfaces 101. Ideally, this difference in bonding type and bonding strength can result in decomposition of the metal-containing precursor species 122a and selective formation of a metal-containing layer on the Cu metal surfaces 105. However, loss of deposition selectivity by decomposition of the metal-containing precursor species 122b on the dielectric layer surfaces 101 may result from imperfections in the dielectric layer 100 or damage in the dielectric layer surfaces 101 due to earlier processing steps. This damage may at least in part be caused by a CMP planarization process that can be utilized to prepare the planarized patterned substrate depicted in FIG. 1A, since typical CMP planarization processes use a corrosive process environment to achieve the desired removal of material from a patterned substrate.

The metal-containing precursor 122 can contain a transition metal, for example ruthenium (Ru), cobalt (Co), molybdenum (Mo), tungsten (W), platinum (Pt), iridium (Ir), rhodium (Rh), or rhenium (Re), or a combination of two or more thereof. However, other metals suitable for use as metal-containing cap layers may be used. The metal-containing precursor 122 may be selected from Ru-containing precursors, Co-containing precursors, Mo-containing precursors, W-containing precursors, Pt-containing precursors, Ir-containing precursors, Rh-containing precursors, and Re-containing precursors. Exemplary Ru-containing precursors include $Ru_3(CO)_{12}$, (2,4-dimethylpentadienyl)(ethylcyclopentadienyl)ruthenium (Ru(DMPD)(EtCp)), bis(2,4-dimethylpentadienyl)ruthenium ($Ru(DMPD)_2$), 4-dimethylpentadienyl)(methylcyclopentadienyl)ruthenium (Ru(DMPD)(MeCp)), or bis(ethylcyclopentadienyl)ruthenium ($Ru(EtCp)_2$). Exemplary Co precursors include $Co_2(CO)_8$, $Co_4(CO)_{12}$, $CoCp(CO)_2$, $Co(CO)_3(NO)$, $Co_2(CO)_6(HCC^tBu)$, $Co(acac)_2$, $Co(Cp)_2$, $Co(Me_5Cp)_2$, $Co(EtCp)_2$, cobalt(II) hexafluoroacetylacetonate hydrate, cobalt tris(2,2,6,6-tetramethyl-3,5-heptanedionate), cobalt(III) acetylacetonate, bis(N,N'-diisopropylacetamidinato) cobalt, and tricarbonyl allyl cobalt. One exemplary Mo precursor is $Mo(CO)_6$. Exemplary W precursors include $W(CO)_6$ or a tungsten halide ($WX_6$, where X is a halogen). Exemplary Pt precursors include $Pt(CO)_2Cl_2$, $Pt(acac)_2$, $Me_2PtC_5H_5$, $Pt(PF_3)_4$, and $MeCpPtMe_3$. Exemplary Ir precursors include $Ir_4(CO)_{12}$, $Ir(allyl)_3$, (methylcyclopentadienyl)(1,5-cyclooctadiene)iridium(I), $(C_6H_7)(C_8H_{12})Ir$, and $IrCl_3$. Exemplary Rh precursors include $Rh(acac)(CO)_2$, $(\eta^5-C_5H_5)Rh(H_2C=CH_2)_2$, $(\eta^5-C_5H_5)Rh(CO)_2$, and $RhCl_3$. One exemplary Re precursor is $Re_2(CO)_{10}$. It will be appreciated by those skilled in the art that a number of other metal-containing precursor gases may be used without departing from embodiments of the present invention.

Figure 1D:
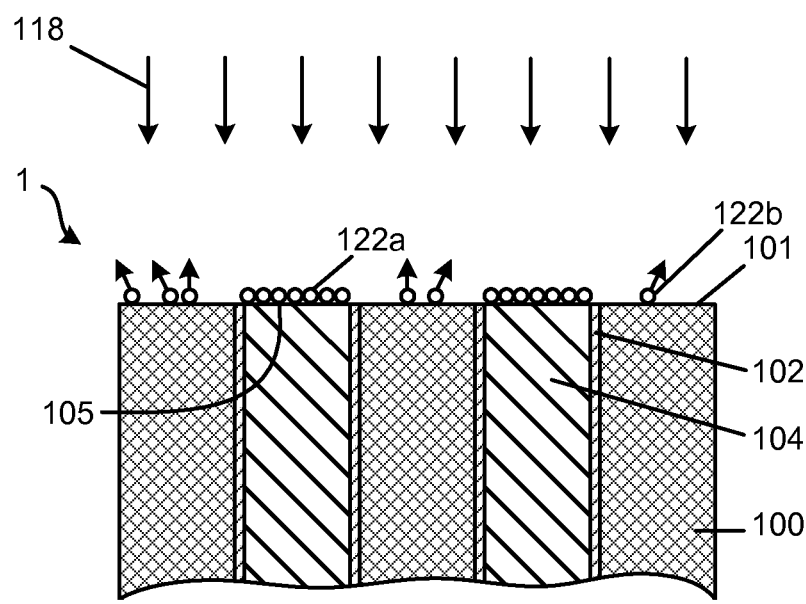
Figure 1E:
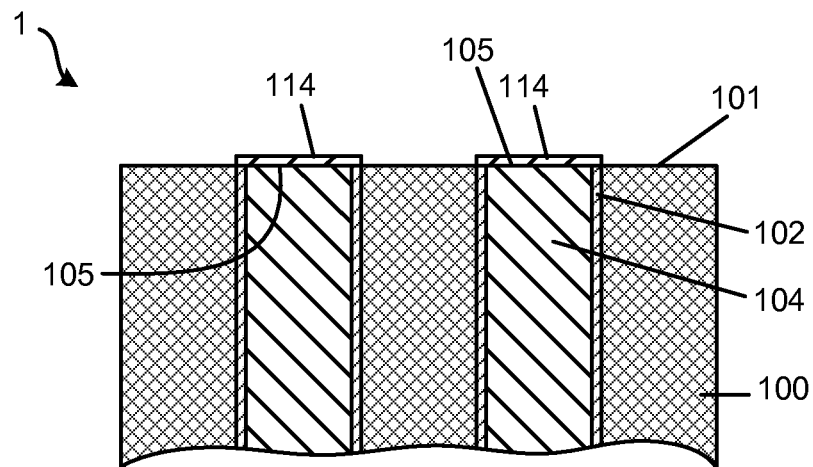

Still referring to the embodiment depicted in FIG. 2A, following the exposure to the gas pulse 210, the patterned substrate 1 is irradiated by a pulse 212 of electromagnetic (EM) radiation. FIG. 1D schematically shows irradiation of the patterned substrate 1 with EM radiation 118. The EM radiation 118 interacts with the patterned substrate 1 and preferentially desorbs weakly bound physisorbed metal-containing precursor species 122b from the dielectric layer surfaces 101. The alternating exposures to the pulses 210 and 212 may be repeated a plurality of times as depicted in FIG. 2A to selectively form metal-containing cap layers 114 with a desired thickness on the Cu metal surfaces 105, as depicted in FIG. 1E.

According to some embodiments of the invention, the metal-containing cap layers 114 can include a Ru metal layer, a Co metal layer, a Mo metal layer, a W metal layer, a Pt metal layer, an Ir metal layer, a Rh metal layer, or a Re metal layer, or a combination thereof. According to other embodiments, the metal-containing cap layers 114 can contain metal-containing compounds of Ru, Co, Mo, W, Pt, Ir, Rh, or Re, or a combination thereof. Examples of these metal-containing compounds include oxides, nitrides, borides, phosphides, or a combination thereof. Other metal-containing compounds can contain silicon (Si), germanium (Ge), or a combination thereof. The metal-containing compounds may, for example, be deposited on the patterned substrate 1 using exposures of a metal-containing precursor and a dopant gas. The dopant gas can, for example, be selected from oxygen-containing gases (e.g., $O_2$, $H_2O$), nitrogen-containing gases (e.g., $NH_3$, $N_2H_4$), nitrogen-oxygen-containing gases (e.g., NO, $NO_2$, $N_2O$), boron-containing gases (e.g., $B_2H_4$, $BCl_3$), phosphorus-containing gases (e.g., $PH_3$, $PF_3$), silicon-containing gases (e.g., $SiH_4$, $Si_2H_6$, $SiH_3Cl$, $SiH_2Cl_2$, $SiHCl_3$, $SiCl_4$, $Si_2Cl_6$, $SiH_3F$, $SiH_2F$, $SiHF_3$, $SiF_4$, or $Si_2F_6$), and germanium-containing gases ($GeH_4$ or $GeCl_4$).

According to some embodiments, the metal-containing cap layers 114 can contain layered structures of one or more of the above metal layers, on or more of the above metal-containing compounds, or a combination thereof.

According to some embodiments of the invention, the EM radiation 118 can include radiant energy in the form of photons, including, in the order of decreasing energy, gamma radiation, X-rays, ultraviolet radiation (UV), visible light, infrared energy, microwave radiation, and radio waves. According to some embodiments of the invention, the EM radiation 118 may contain single-frequency or multi-frequency EM radiation with frequencies corresponding to wavelengths less than about 500 nm. However, frequencies corresponding to wavelength greater than about 500 nm may also be used. According to one embodiment of the invention, the EM radiation 118 can include wavelengths between about 500 nm and about 125 nm. Examples of EM radiation sources that can be employed to generate components of the single frequency or multi-frequency ultra-violet electromagnetic radiation include $Xe_2$ (172 nm), KrCl (222 nm), KrF (248 nm), $F_2$ (157 nm), ArF (193 nm), XeCl (308 nm), or XeF (351 nm) excimer lamps. According to one embodiment of the invention, the EM radiation 118 can contain diffuse. According to another embodiment of the invention, the EM radiation 118 can contain collimated radiation.

In one example, an average thickness of the metal-containing cap layers 114 can be between 5 Angstrom ($10^{-10}$ m) and 100 Angstrom, for example about 5, 10, 15, 20, 30, 40, 50, 60, 70, 80, 90, or 100 Angstrom. However, embodiments of the invention are not limited to those thicknesses and thicker metal-containing cap layers 114 may be formed. For very thin metal-containing cap layers 114, for example about between 5 Angstrom and 20 Angstrom, the surface coverage of the metal-containing cap layers 114 on the Cu metal surfaces 105 may be incomplete or discontinuous with gaps that expose the Cu metal surfaces 105.

Figure 2B:
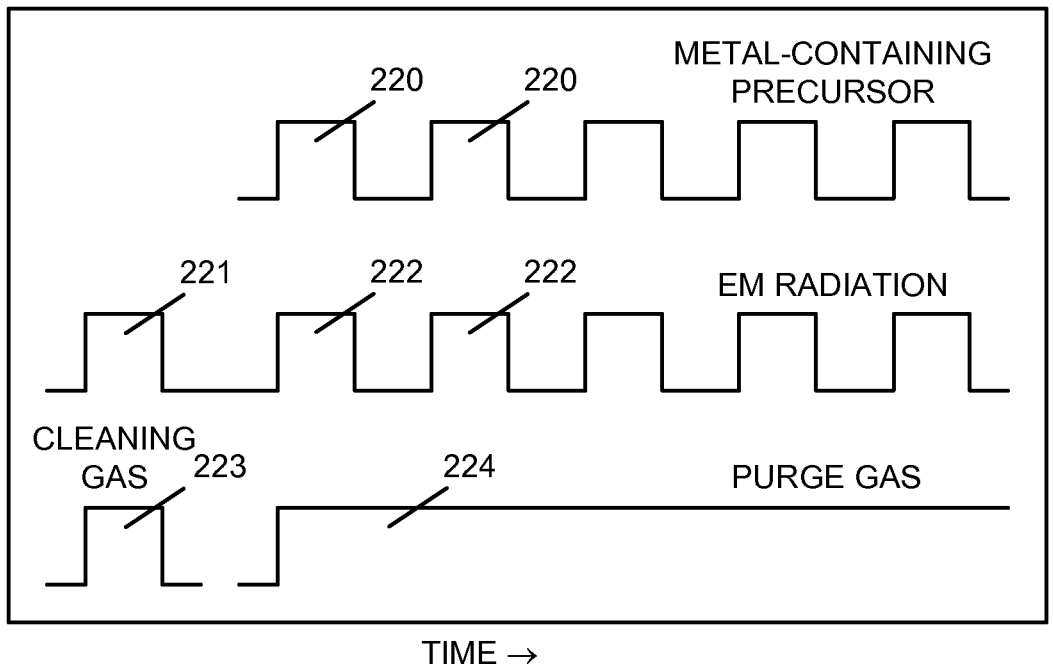

FIG. 2B schematically shows gas and EM radiation exposures during formation of metal-containing cap layers according to one embodiment of the invention. The patterned substrate 1 depicted in FIG. 1B may be pre-treated by irradiating the patterned substrate 1 with a pulse 221 of EM radiation 117 and optionally exposed to a pulse 223 of a cleaning gas prior to formation of metal-containing cap layers on the Cu metal surfaces 105. An exemplary pre-treating step was described above in reference to FIG. 2A.

Figure 1F:
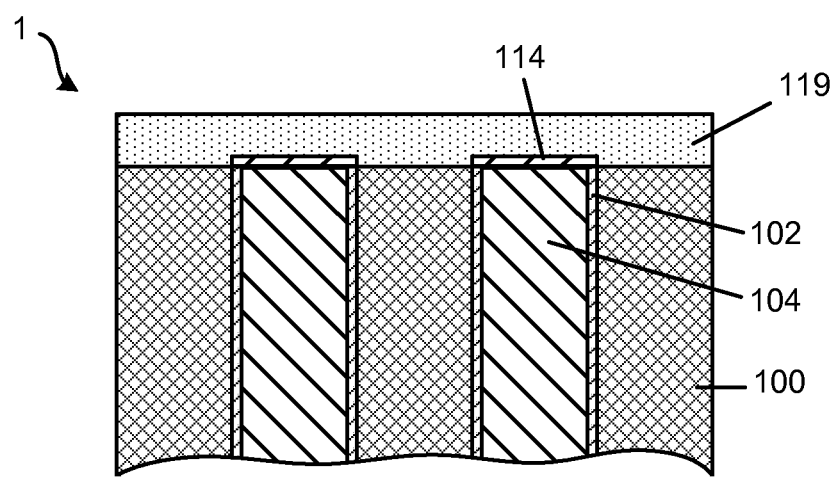
Figure 1G:
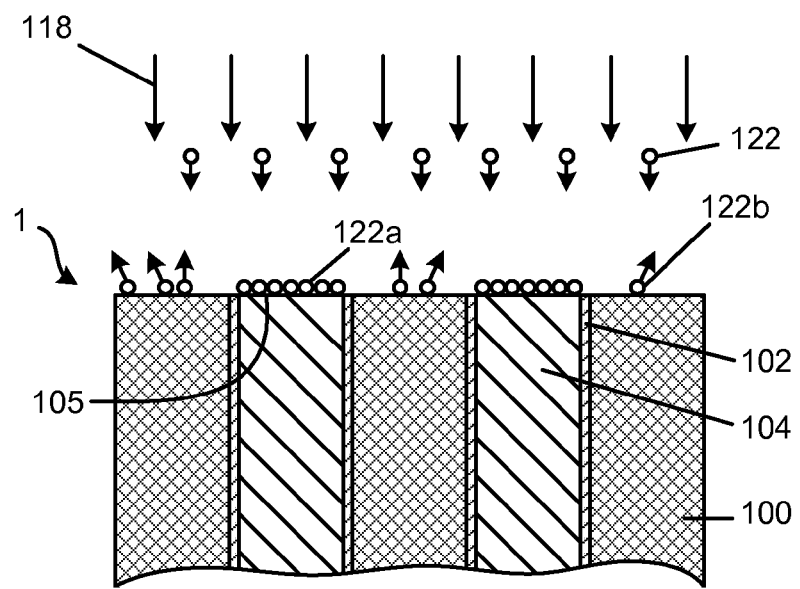

Following the optional pre-treating step, the patterned substrate 1 is simultaneously exposed to a pulse 220 containing a metal-containing precursor 122 and irradiated by a pulse 222 of EM radiation 118. FIG. 2B further shows an optional flow 224 of a purge gas. FIG. 1G schematically shows simultaneous exposure of the metal-containing precursor 122 and irradiation with EM radiation 118. As depicted in FIG. 2B, the fully overlapping exposures to the pulses 220 and 222 may be repeated a plurality of times to selectively form metal-containing cap layers 114 with a desired thickness on the Cu metal surfaces 105, as depicted in FIG. 1E.

Figure 2C:
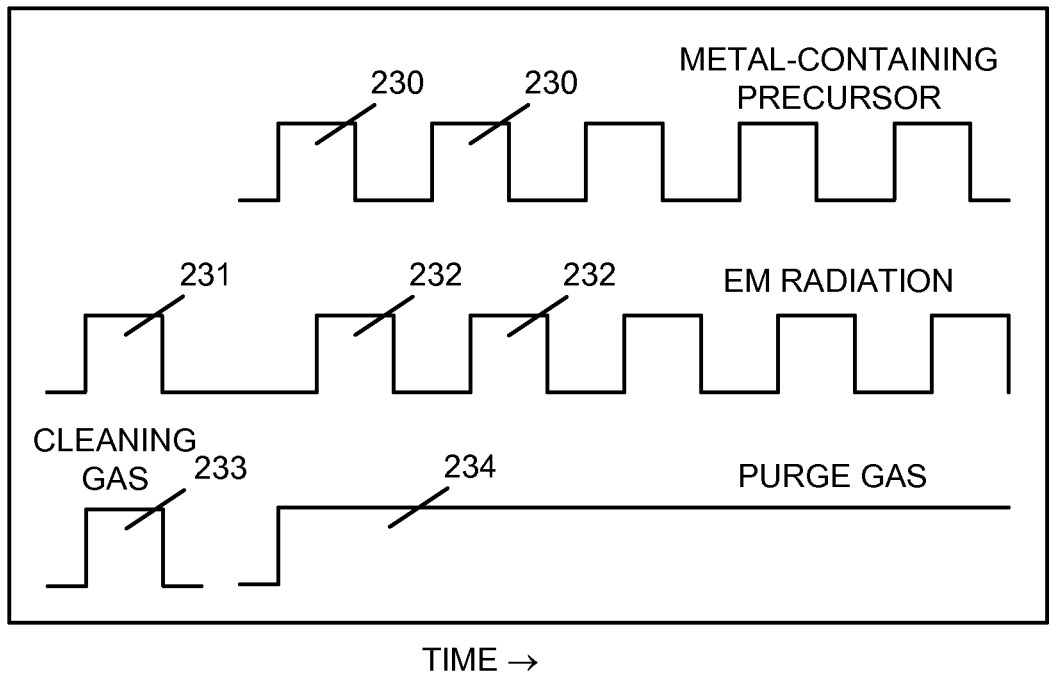

FIG. 2C schematically shows gas and EM radiation exposures during formation of metal-containing cap layers according to another embodiment of the invention. The patterned substrate 1 depicted in FIG. 1B may be pre-treated by irradiating the patterned substrate 1 with a pulse 231 of EM radiation 117 and optionally exposed to a pulse 233 of a cleaning gas prior to formation of metal-containing cap layers on the Cu metal surfaces 105. An exemplary pre-treating step was described above in reference to FIG. 2A.

Following the optional pre-treating step, the patterned substrate 1 is exposed to a pulse 230 containing a metal-containing precursor 122 and irradiated by a pulse 232 of EM radiation 118, where the pulses 230 and 232 partially overlap in time. FIG. 2C further shows an optional flow 234 of a purge gas. As depicted in FIG. 2C, the partially overlapping exposures to the pulses 230 and 232 may be repeated a plurality of times to selectively form metal-containing cap layers 114 the Cu metal surfaces 105 with a desired thickness, as depicted in FIG. 1E.

Figure 2D:
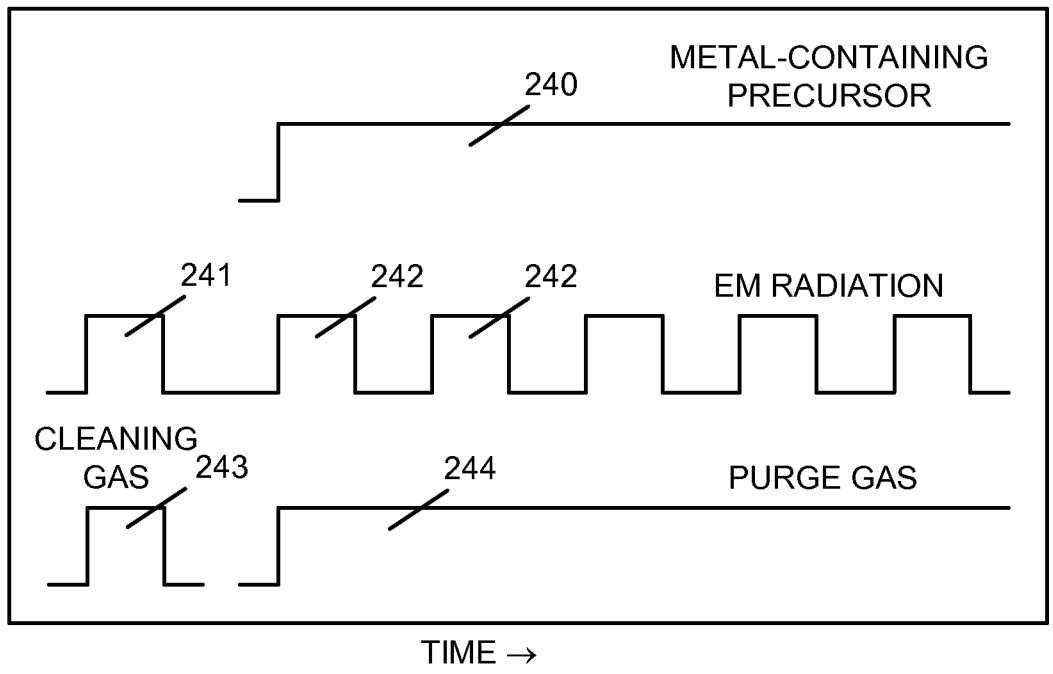

FIG. 2D schematically shows gas and EM radiation exposures during formation of metal-containing cap layers according to yet another embodiment of the invention. The patterned substrate 1 depicted in FIG. 1B may be pre-treated by irradiating the patterned substrate 1 with a pulse 241 of EM radiation 117 and optionally exposed to a pulse 243 of a cleaning gas prior to formation of metal-containing cap layers on the Cu metal surfaces 105. An exemplary pre-treating step was described above in reference to FIG. 2A.

Following the optional pre-treating step, the patterned substrate 1 is exposed to a flow 240 containing a metal-containing precursor 122 and irradiated with sequential pulses 242 of EM radiation 118. FIG. 2D further shows an optional flow 244 of a purge gas. As depicted in FIG. 2D, the exposures to the flow 240 and the sequential pulses 242 may be carried out for a desired length of time to selectively form metal-containing cap layers 114 the Cu metal surfaces 105 with a desired thickness, as depicted in FIG. 1E.

Figure 2E:
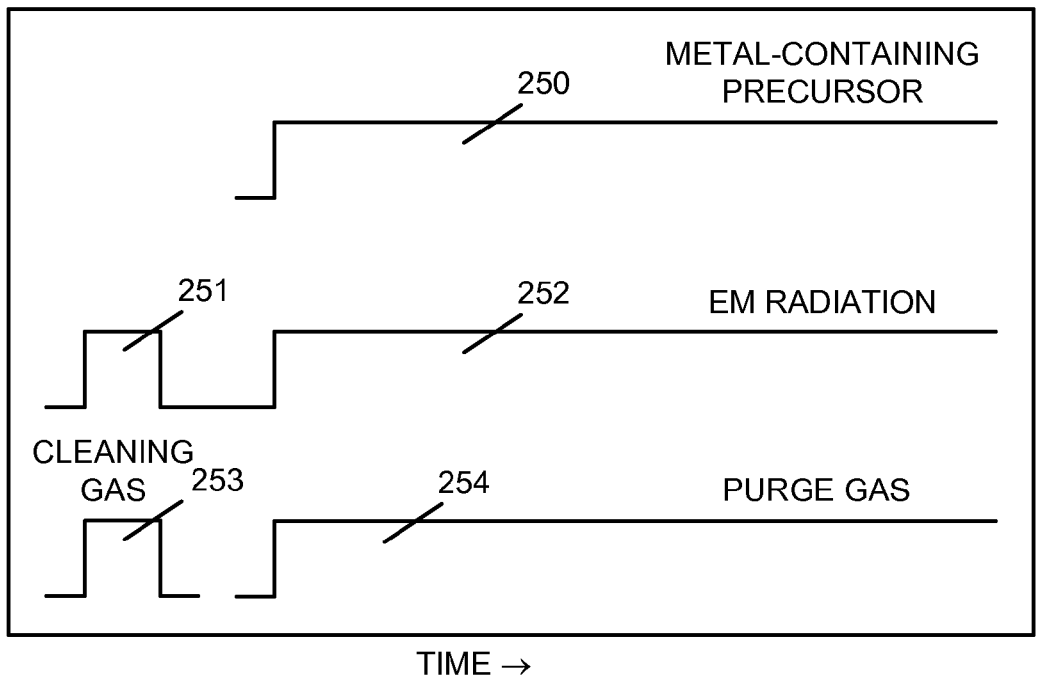

FIG. 2E schematically shows gas and EM radiation exposures according to another embodiment of the invention. The patterned substrate 1 depicted in FIG. 1B may be pre-treated by irradiating the patterned substrate 1 with a pulse 251 of EM radiation 117 and optionally exposed to a pulse 253 of a cleaning gas prior to formation of metal-containing cap layers on the Cu metal surfaces 105. An exemplary pre-treating step was described above in reference to FIG. 2A.

Following the optional pre-treating step, the patterned substrate 1 is exposed to a flow 250 containing a metal-containing precursor 122 and irradiating the patterned substrate 1 with an exposure 252 of EM radiation 118. FIG. 2E further shows an optional flow 224 of a purge gas. As depicted in FIG. 2E, the exposure to the flow 250 and the irradiation with exposure 252 may be performed for a desired length of time to selectively form metal-containing cap layers 114 the Cu metal surfaces 105 with a desired thickness, as depicted in FIG. 1E.

Figure 2F:
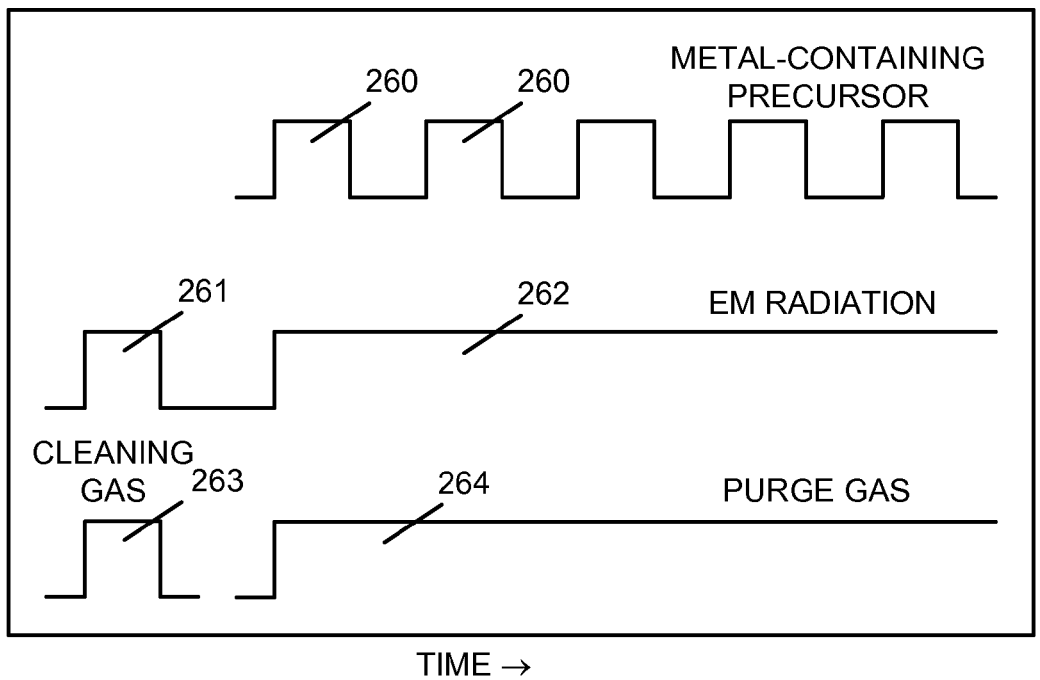

FIG. 2F schematically shows gas and EM radiation exposures according to another embodiment of the invention. The patterned substrate 1 depicted in FIG. 1B may be pre-treated by irradiating the patterned substrate 1 with a pulse 261 of EM radiation 117 and optionally exposed to a pulse 263 of a cleaning gas prior to formation of metal-containing cap layers on the Cu metal surfaces 105. An exemplary pre-treating step was described above in reference to FIG. 2A.

Following the optional pre-treating step, the patterned substrate 1 is exposed to sequential pulses 260 containing a metal-containing precursor 122 while irradiating the patterned substrate 1 with an exposure 262 of EM radiation 118. FIG. 2F further shows an optional flow 264 of a purge gas. As depicted in FIG. 2F, the exposures to the sequential pulses 260 and the irradiation with exposure 262 may be performed for a desired length of time to selectively form metal-containing cap layers 114 the Cu metal surfaces 105 with a desired thickness, as depicted in FIG. 1D.

Following the formation of the metal-containing cap layers 114, the partially manufactured semiconductor device may be further processed. FIG. 1F shows a dielectric diffusion barrier layer 119 formed on the metal-containing cap layers 114 and on the dielectric layer surfaces 101. The dielectric diffusion barrier layer 119 can, for example, contain silicon nitride (SiN), silicon carbide (SiC), or silicon carbonitride (SiCN).

Figure 3A:
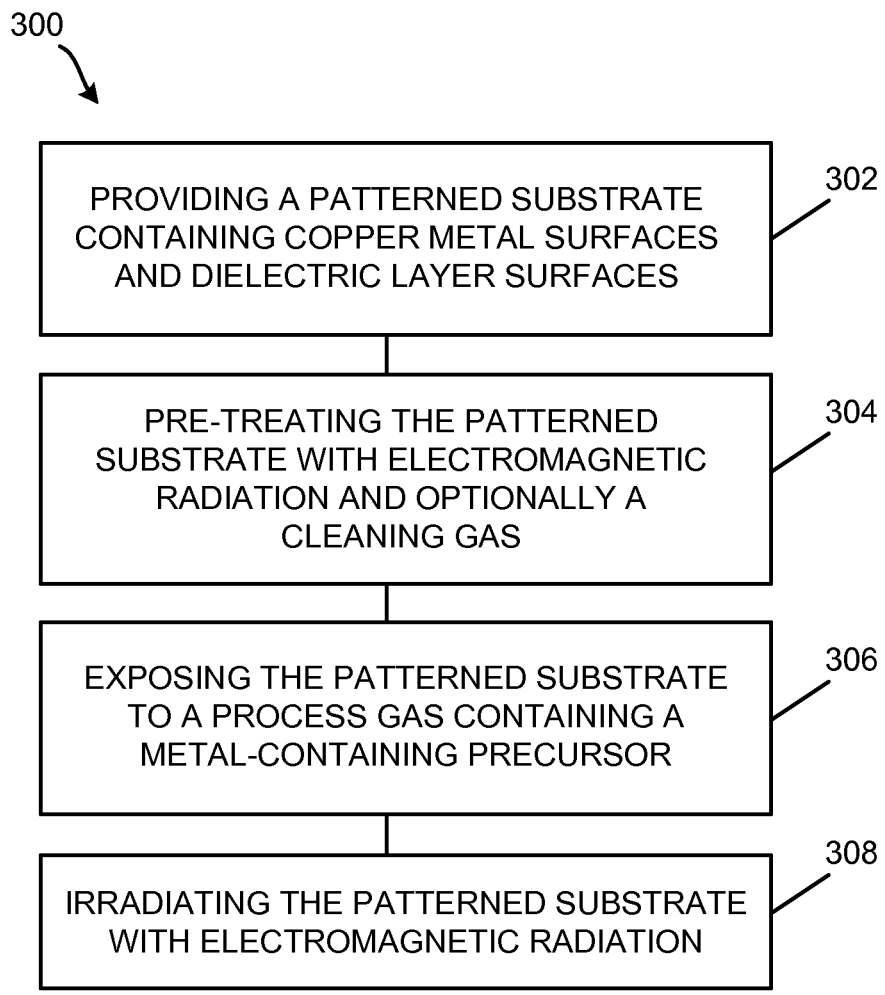
FIGS. 3A-3C are process flow diagrams for forming metal-containing cap layers on a patterned substrate according to embodiments of the invention.
Figure 3B:
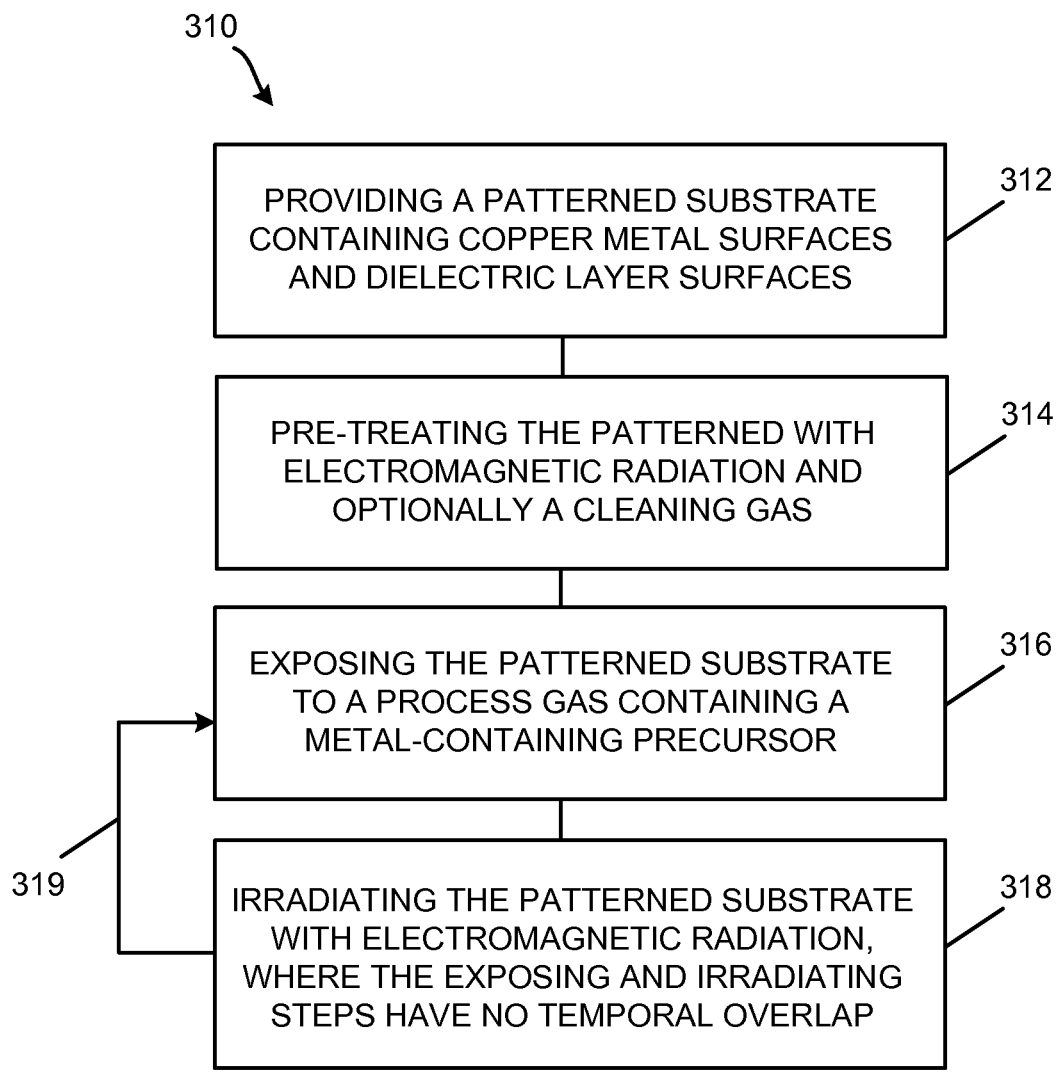
Figure 3C:
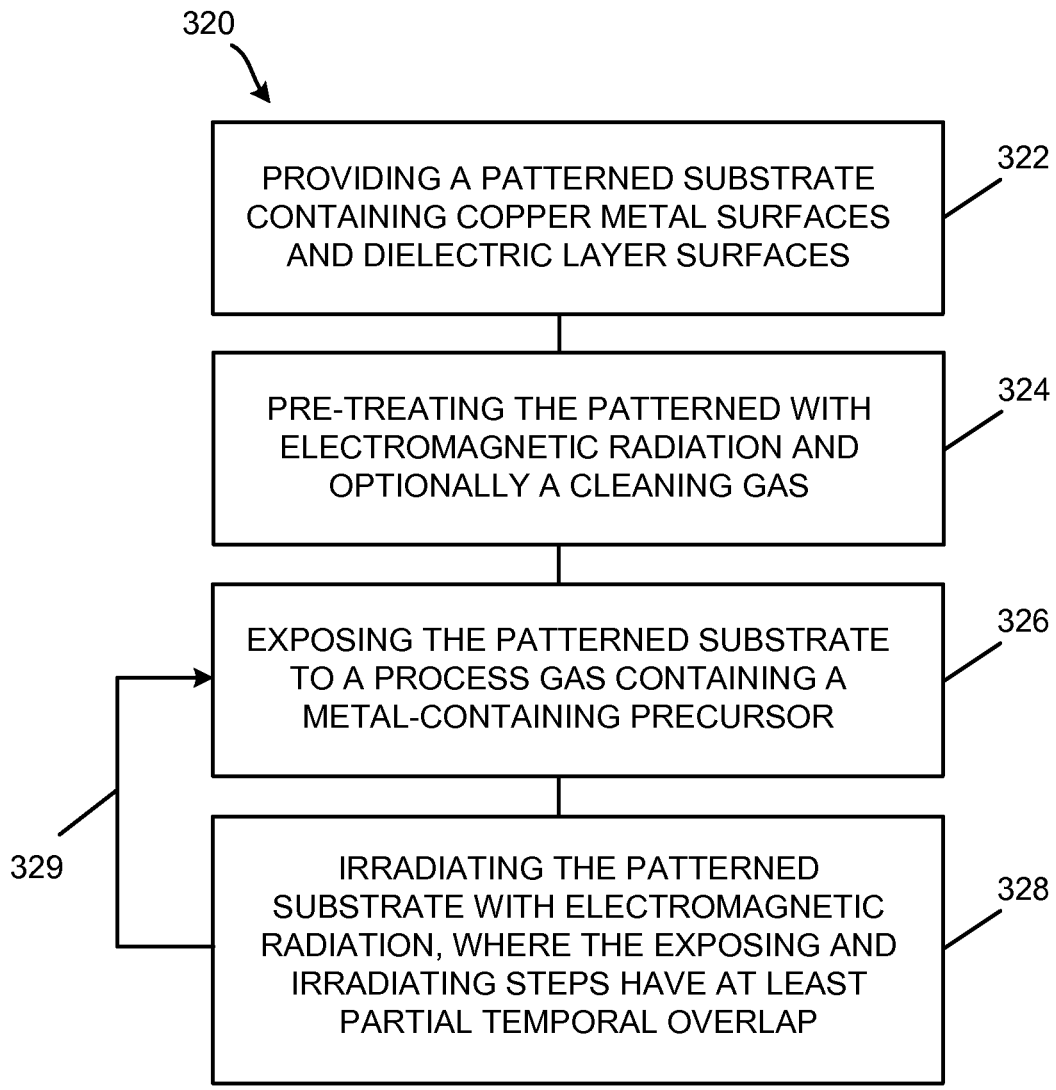

FIGS. 3A-3C are process flow diagrams for forming metal-containing cap layers on a patterned substrate according to embodiments of the invention. In FIG. 3A, the process 300 includes, at 302, providing a patterned substrate containing Cu metal surfaces and dielectric layer surfaces. At 304, the patterned substrate is pre-treated with EM radiation and optionally a cleaning gas. According to some embodiments of the invention, the pre-treating may be omitted from the process 300. At 306, the patterned substrate is exposed to a process gas containing a metal-containing precursor and optionally a dopant gas, and at 308, the patterned substrate is irradiated with electromagnetic radiation.

FIG. 3B is a process flow diagram for forming metal-containing cap layers according to one embodiment of the invention. Referring also to FIG. 2A, the process 310 includes, at 312, providing a patterned substrate containing Cu metal surfaces and dielectric layer surfaces, and at 314, pre-treating the patterned substrate with a pulse 211 of EM radiation and optionally a pulse 213 of a cleaning gas. According to one embodiment of the invention, the pre-treating may be omitted from the process 310. At 316, the patterned substrate is exposed to a process gas containing a pulse 210 of a metal-containing precursor and optionally a dopant gas, and at 318, the patterned substrate is irradiated with a pulse 212 of EM radiation. A flow 214 of a purge gas may be utilized during steps 316 and 318. Steps 316 and 318 are performed sequentially and do not overlap in time. Steps 316 and 318 may be repeated, as indicated by process arrow 319, until metal-containing cap layers with desired thickness and elemental composition has been selectively formed on the Cu metal surfaces.

FIG. 3C is a process flow diagram for forming metal-containing cap layers according to one embodiment of the invention. Referring also to FIG. 2B, the process 320 includes, at 322, providing a patterned substrate containing Cu metal surfaces and dielectric layer surfaces, and at 324, pre-treating the patterned substrate with a pulse 221 of EM radiation and optionally a pulse 223 of a cleaning gas. According to one embodiment of the invention, the pre-treating may be omitted from the process 320. At 326, the patterned substrate is exposed to a process gas containing a pulse 220 of a metal-containing precursor and optionally a dopant gas, and at 328, the patterned substrate is irradiated with a pulse 222 of EM radiation. A flow 224 of a purge gas may be utilized during and between steps 326 and 328. Steps 326 and 328 at least partially overlap in time. In the embodiment depicted in FIG. 2B, the pulses 220 and 222 fully overlap in time. Steps 326 and 328 may be repeated, as indicated by process arrow 329 in FIG. 3C, until metal-containing cap layers with desired thickness and elemental composition have been formed on the Cu metal surfaces.

Referring now to FIGS. 3C and 2C, according to another embodiment of the invention, the patterned substrate may be pre-treated with a pulse 231 of EM radiation and optionally a pulse 233 of a cleaning gas. At 326, the patterned substrate is exposed to a process gas containing a pulse 230 containing a metal-containing precursor and optionally a dopant gas, and at 328, the patterned substrate is irradiated with a pulse 232 of EM radiation. A flow 234 of a purge gas may be utilized during and between steps 326 and 328. In the embodiment depicted in FIG. 2C, the pulses 230 and 232 only partially overlap in time. Steps 326 and 328 may be repeated, as indicated by process arrow 329 in FIG. 3C, until metal-containing cap layers with desired thickness and elemental composition have been formed on the Cu metal surfaces.

Referring now to FIGS. 3C and 2D, according to yet another embodiment of the invention, the patterned substrate may be pre-treated with a pulse 241 of EM radiation and optionally a pulse 243 of a cleaning gas. At 326, the patterned substrate is exposed to a flow 240 of process gas containing a metal-containing precursor and optionally a dopant gas, and at 328, the patterned substrate is irradiated with sequential pulses 242 of EM radiation. A flow 244 of a purge gas may be utilized during steps 326 and 328. The patterned substrate may be exposed to the flow 240 and sequential pulses 242 until metal-containing cap layers with desired thickness and elemental composition have been formed on the Cu metal surfaces.

Referring now to FIGS. 3C and 2E, according to still another embodiment of the invention, the patterned substrate may be pre-treated with a pulse 251 of EM radiation and optionally a pulse 253 of a cleaning gas. At 326, the patterned substrate is exposed to a flow 240 of process gas containing a metal-containing precursor and optionally a dopant gas, and at 328, the patterned substrate is irradiated with a exposure 252 of EM radiation. A flow 254 of a purge gas may be utilized during steps 326 and 328. The patterned substrate may be exposed to the flow 250 and exposure 252 until metal-containing cap layers with desired thickness and elemental composition have been formed on the Cu metal surfaces.

According to embodiments of the invention, the length of each pulse 210-213, 220-223, 230-233, 241-243, 251, 253, 260, 261, and 263 shown in FIGS. 2A-2F can, for example, be between about 0.1 sec and about 100 sec. Alternately, the length of each pulse can be between about 1 sec and about 10 sec. Exemplary lengths for gas pulses 210, 220, 230, and 260 containing metal-containing precursors can be between 0.3 and 3 sec, for example 1 sec. As depicted in FIGS. 2A-2F, gas flows 214, 224, 234, 240, 244, 250, 254, 262, and 264, may be continuous during deposition of the metal-containing cap layers. However, this is not required for some embodiments of the invention, as one or more of these gas flows may vary during the deposition of the metal-containing cap layers.

According to one embodiment of the invention, the metal-containing cap layers can contain Ru metal or compounds of Ru that may be deposited by exposing the patterned substrate 1 to a Ru-containing precursor containing $Ru_3(CO)_{12}$. An exemplary thermal chemical vapor deposition (TCVD) process for depositing Ru metal using a $Ru_3(CO)_{12}$ precursor and a CO carrier gas is described in U.S. Pat. No. 7,270,848, the content of which is herein incorporated by reference.

Adsorption of $Ru_3(CO)_{12}$ precursor vapor on a metal surface is thought to result in partial decomposition of the $Ru_3(CO)_{12}$ precursor to adsorbed $Ru_3(CO)_x$ and CO species on the surface, followed by further decomposition of adsorbed $Ru_3(CO)_x$ to Ru metal and CO that desorbs from the substrate (Equation 1).

$$Ru_3(CO)_{12}(g) \Leftrightarrow Ru_3(CO)_x(ad)+(12-x)CO(ad) \Rightarrow 3Ru(s)+(12-x)CO(g) \quad (1)$$

Referring back to FIG. 1C, it is believed that the preferential deposition of Ru metal observed on Cu metal surfaces 105 using a $Ru_3(CO)_{12}$ precursor 122 is at least in part due to shorter residence time (τ) of the $Ru_3(CO)_{12}$ species 122b on the dielectric layer surfaces 101 than the $Ru_3(CO)_{12}$ species on the Cu metal surfaces 105. The residence time refers to the length of time that the $Ru_3(CO)_{12}$ species (122a and/or 122b) are adsorbed on a surface before either desorbing from the surface or thermally decomposing on the surface. It is estimated that the residence time of a $Ru_3(CO)_{12}$ species 122b on the dielectric layer surfaces 101 is approximately $10^{31}$ 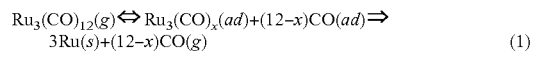 10 seconds but the residence time of $Ru_3(CO)_{12}$ species 122a is approximately $10^{-6}$-$10^{-4}$ seconds on the Cu metal surfaces 105. However, loss of deposition selectivity by decomposition of $Ru_3(CO)_{12}$ species 122b on the dielectric layer surfaces 101 may result from unwanted adsorptions sites on the dielectric layer surfaces 101, imperfections in the dielectric layer 100, damage in the dielectric layer surfaces 101 due to earlier processing steps, or the presence of contaminants or hydroxyl groups on the dielectric layer surfaces 101. This damage may at least in part be caused by a CMP planarization process that can be utilized to prepare the planarized patterned substrate depicted in FIG. 1A.

According to one embodiment of the invention, the metal-containing cap layers may contain compounds of Ru, for example Ru-oxide, Ru-nitride, Ru-boride, Ru-phosphide, or a combination thereof. Compounds of Ru may be deposited on a patterned substrate using simultaneous or sequential exposures of a Ru-containing precursor (e.g., $Ru_3(CO)_{12}$) and a dopant gas. The dopant gas can, for example, be selected from oxygen-containing gases (e.g., $O_2$, $H_2O$), nitrogen-containing gases (e.g., $NH_3$, $N_2H_4$), nitrogen- and oxygen-containing gases (e.g., NO, $NO_2$, $N_2O$), boron-containing gases (e.g., $B_2H_4$, $BCl_3$), or phosphorus-containing gases ($PH_3$, $PF_3$).

Figure 4:
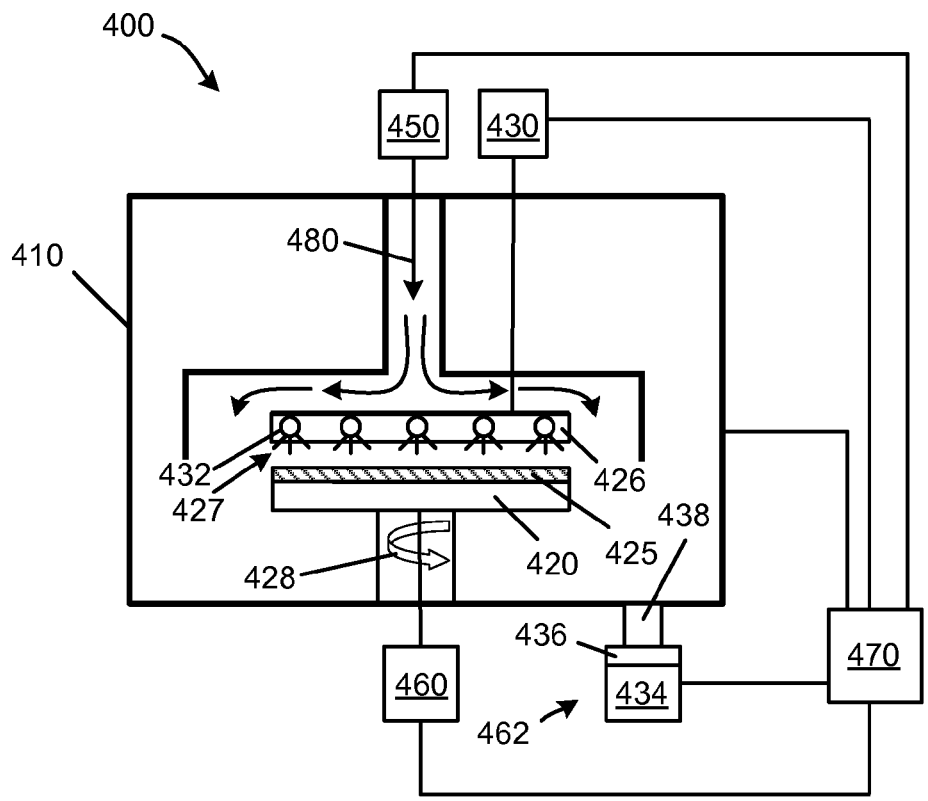
FIG. 4 schematically shows a processing system configured for forming metal-containing cap layers on a patterned substrate according an embodiment of the invention.

FIG. 4 schematically shows a processing system configured for forming metal-containing cap layers on a patterned substrate according an embodiment of the invention. The processing system 400 contains a process chamber 410 having a substrate holder 420 configured to support a patterned substrate 425. The substrate holder 420 contains a rotation mechanism 428 for rotating the substrate 425 for improved process uniformity across the substrate 425. The process chamber 410 further contains an electromagnetic radiation assembly 426 containing light sources 432 for generating and exposing the patterned substrate 425 to electromagnetic radiation 427. Additionally, the processing system 400 contains a power source 430 coupled to and powering the electromagnetic radiation assembly 426. A substrate temperature control system 460 is coupled to substrate holder 420 and configured to control the temperature of patterned substrate 425. A gas supply system 450 is coupled to the process chamber 410 and configured to introduce a process gas to process chamber 410. The gas supply system 450 is configured to alternately or simultaneously introduce a cleaning gas, a metal-containing precursor vapor, a dopant gas, or a purge gas, or a combination of two or more thereof, to the process chamber 410.

According to one embodiment of the invention, the electromagnetic radiation assembly 426 in FIG. 4 is configured to expose the patterned substrate 425 to diffuse radiation 427 that is nearly isotropic (i.e., not strongly directional). In other words, the diffuse radiation 427 is not predominantly incident to the patterned substrate 425 from any particular direction. Electromagnetic radiation assemblies capable of producing diffuse radiation are well known to those skilled in the art. For example, the electromagnetic radiation assembly 426 can be capable of generating an output between about 10 mW/cm$^2$ and about 1000 mW/cm$^2$. According to another embodiment of the invention, the output can be between about 50 mW/cm$^2$ and about 500 mW/cm$^2$.

According to another embodiment of the invention, the electromagnetic radiation assembly 426 in FIG. 4 is configured to expose the patterned substrate 425 to collimated radiation 427 having electromagnetic rays that are substantially parallel to each other. Electromagnetic radiation assemblies capable of producing collimated radiation are well known to those skilled in the art. For example, the collimated radiation 427 can be formed by collimating diffuse radiation from one or more radiation sources housed in the electromagnetic radiation assembly 426 using a condenser lens, or other devices such as one or more baffles.

According to some embodiments of the invention, the EM radiation 427 can contain diffuse or collimated, single-frequency or multi-frequency, gamma radiation, X-rays, ultra-violet radiation (UV), visible light, infrared energy, microwave radiation, or radio waves. According to some embodiments of the invention, the EM radiation 118 may contain single-frequency or multi-frequency EM radiation with frequencies corresponding to wavelengths less than about 500 nm. However, frequencies corresponding to wavelength greater than about 500 nm may also be used. According to one embodiment of the invention, the EM radiation 118 can include wavelengths between about 500 nm and about 125 nm. Examples of EM radiation sources that can be employed to generate components of the single frequency or multi-frequency ultra-violet electromagnetic radiation include $Xe_2$ (172 nm), KrCl (222 nm), KrF (248 nm), $F_2$ (157 nm), ArF (193 nm), XeCl (308 nm), or XeF (351 nm) excimer lamps.

Referring still to FIG. 4, the processing system 400 may be configured to process 200 mm substrates, 300 mm substrates, or larger-sized substrates. In fact, it is contemplated that the processing system may be configured to process substrates, wafers, or LCDs regardless of their size, as would be appreciated by those skilled in the art. Therefore, while aspects of the invention will be described in connection with the processing of a semiconductor substrate, the invention is not limited solely thereto.

The substrate temperature control system 460 is configured for controlling the temperature of the patterned substrate 425 between about 0° C. and about 1000° C. The substrate temperature control system 460 can, for example, be configured to elevate and control the substrate temperature from room temperature to approximately 600° C. It is to be understood, however, that the temperature of the substrate is selected based on the desired temperature for causing deposition of a particular metal-containing cap layer material on the surface of a patterned substrate. The substrate temperature control system 460 includes temperature control elements, such as a recirculating coolant system that, when cooling, receives heat from substrate holder 420 and transfers heat to a heat exchanger system (not shown), or when heating, transfers heat from the heat exchanger system. Additionally, the temperature control elements can include heating/cooling elements, such as resistive heating elements, or thermoelectric heaters/coolers, which can be provided in the substrate holder 420, as well as the chamber wall of the process chamber 410 and any other component within the processing system 400.

In order to improve the thermal transfer between patterned substrate 425 and substrate holder 420, the substrate holder 420 can include a mechanical clamping system, or an electrical clamping system, such as an electrostatic clamping system, to affix patterned substrate 425 to an upper surface of substrate holder 420. Furthermore, substrate holder 420 can further include a substrate backside gas delivery system configured to introduce gas to the back-side of patterned substrate 425 in order to improve the gas-gap thermal conductance between the patterned substrate 425 and the substrate holder 420. Such a system can be utilized when temperature control of the substrate is required at elevated or reduced temperatures. For example, the substrate backside gas system can comprise a two-zone gas distribution system, wherein the helium gas gap pressure can be independently varied between the center and the edge of patterned substrate 425.

Furthermore, the process chamber 410 can be further coupled to a pressure control system 462, including, for example, a vacuum pumping system 434 and a valve 436, through a duct 438, wherein the pressure control system 434 is configured to controllably evacuate the process chamber 410 to a pressure suitable for forming metal-containing cap layers on patterned substrate 425.

The vacuum pumping system 434 can include a turbo-molecular vacuum pump (TMP) capable of a pumping speed up to about 5000 liters per second (and greater) and valve 436 can include a gate valve for throttling the chamber pressure. Moreover, a device for monitoring chamber pressure (not shown) can be coupled to the process chamber 410. The pressure measuring device can, for example, be an absolute capacitance manometer.

Processing conditions for forming metal-containing cap layers can include a substrate temperature between about 0° C. and about 1000° C. Alternately, the substrate temperature can be between about 200° C. and about 1000° C., or between about 400° C. and about 700° C. The pressure in the process chamber 410 can, for example, be maintained between about $10^{-5}$ Torr and about 3000 mTorr. Alternately, the pressure can be maintained between about 20 mTorr and about 1000 mTorr. Yet alternately, the pressure can be maintained between about 50 mTorr and about 500 mTorr.

Additionally, the processing system 400 contains a controller 470 coupled to the process chamber 410, power source 430, vacuum pumping system 434, gas delivery system 450, and substrate temperature control system 460. Alternately, or in addition, controller 470 can be coupled to a one or more additional controllers/computers (not shown), and controller 470 can obtain setup and/or configuration information from an additional controller/computer.

The controller 470 can be used to configure any number of processing elements (410, 430, 434, 450, and 460), and the controller 470 can collect, provide, process, store, and display data from processing elements. The controller 470 can comprise a number of applications for controlling one or more of the processing elements. For example, controller 470 can include a graphic user interface (GUI) component (not shown) that can provide easy to use interfaces that enable a user to monitor and/or control one or more processing elements.

Controller 470 can comprise a microprocessor, memory, and a digital I/O port capable of generating control voltages sufficient to communicate and activate inputs to processing system 400 as well as monitor outputs from processing system 400. For example, a program stored in the memory may be utilized to activate the inputs to the aforementioned components of the processing system 400 according to a process recipe in order to perform process. One example of the controller 470 is a general purpose computer, available from Dell Corporation, Austin, Tex.

The controller 470 may be locally located relative to the processing system 400, or it may be remotely located relative to the processing system 400. For example, the controller 470 may exchange data with the processing system 400 using at least one of a direct connection, an intranet, the Internet and a wireless connection. The controller 470 may be coupled to an intranet at, for example, a customer site (i.e., a device maker, etc.), or it may be coupled to an intranet at, for example, a vendor site (i.e., an equipment manufacturer). Additionally, for example, the controller 470 may be coupled to the Internet. Furthermore, another computer (i.e., controller, server, etc.) may access, for example, the controller 470 to exchange data via at least one of a direct connection, an intranet, and the Internet. As also would be appreciated by those skilled in the art, the controller 470 may exchange data with the processing system 400 via a wireless connection.

A plurality of embodiments for integrating metal-containing cap layers into manufacturing of semiconductor devices to improve electromigration and stress migration in Cu metallization has been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a patterned substrate is directly on and in immediate contact with the substrate; there may be a second film or other structure between the film and the substrate.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming a semiconductor device, comprising:
    providing a patterned substrate containing copper (Cu) metal surfaces and dielectric layer surfaces;
    exposing the patterned substrate to a process gas comprising a metal-containing precursor to adsorb the metal-containing precursor on the Cu metal surfaces and on the dielectric layer surfaces; and
    irradiating the adsorbed metal-containing precursor on the Cu metal surfaces and on the dielectric layer surfaces with electromagnetic radiation to desorb the adsorbed metal-containing precursor from the dielectric surfaces, and thereby form a metal-containing cap layer on the Cu metal surfaces but not on the dielectric layer surfaces.

2. The method of claim 1, wherein the metal-containing cap layer comprises a Ru metal layer, a Co metal layer, a Mo metal layer, a W metal layer, a Pt metal layer, an Ir metal layer, a Rh metal layer, or a Re metal layer, or a combination thereof.

3. The method of claim 1, wherein the metal-containing cap layer comprises Ru, Co, Mo, W, Pt, Ir, Rh, or Re, and a dopant selected from oxygen, nitrogen, boron, phosphorus, silicon, germanium, or a combination thereof.

4. The method of claim 1, wherein the metal-containing precursor comprises a Ru-containing precursor, a Co-containing precursor, a Mo-containing precursor, a W-containing precursor, a Pt-containing precursor, an Ir-containing precursor, a Rh-containing precursor, or a Re-containing precursor, or a combination of two or more thereof.

5. The method of claim 1, wherein the process gas further comprises a dopant gas containing an oxygen-containing gas, a nitrogen-containing gas, a nitrogen-oxygen-containing gas, a boron-containing gas, or a phosphorus-containing gas, or a combination thereof.

6. The method of claim 1, wherein the electromagnetic radiation comprises ultra-violet radiation.

7. The method of claim 6, wherein the electromagnetic radiation comprises $Xe_2$ radiation at about 172 nm, KrCl radiation at about 222 nm, KrF radiation at about 248 nm, $F_2$ radiation at about 157 nm, ArF radiation at about 193 nm, XeCl radiation at about 308 nm, or XeF radiation at about 351 nm, or a combination of two or more thereof.

8. The method of claim 1, wherein the exposing and irradiating have no temporal overlap.

9. The method of claim 1, wherein the exposing and irradiating have at least partial temporal overlap.

10. The method of claim 1, further comprising
prior to the exposing, pre-treating the patterned substrate with additional electromagnetic radiation and optionally a cleaning gas.

11. The method of claim 10, wherein the additional electromagnetic radiation comprises ultra-violet radiation.

12. The method of claim 11, wherein the additional electromagnetic radiation comprises $Xe_2$ radiation at about 172 nm, KrCl radiation at about 222 nm, KrF radiation at about 248 nm, $F_2$ radiation at about 157 nm, ArF radiation at about 193 nm, XeCl radiation at about 308 nm, or XeF radiation at about 351 nm, or a combination of two or more thereof.

13. A method of forming a semiconductor device, comprising:
providing a patterned substrate containing copper (Cu) metal surfaces and dielectric layer surfaces;
exposing the patterned substrate to a process gas comprising a metal-containing precursor to adsorb the metal-containing precursor on the Cu metal surfaces and on the dielectric layer surfaces;
irradiating the Cu metal surfaces and the dielectric layer surfaces on the patterned substrate with ultra-violet electromagnetic radiation to desorb the adsorbed metal-containing precursor from the dielectric surfaces, and thereby form a metal-containing cap layer on the Cu metal surfaces but not on the dielectric layer surfaces; and
prior to the exposing, pre-treating the patterned substrate with additional ultra-violet electromagnetic radiation and optionally a cleaning gas.

14. The method of claim 13, wherein the metal-containing cap layer comprises a Ru metal layer, a Co metal layer, a Mo metal layer, a W metal layer, a Pt metal layer, an Jr metal layer, a Rh metal layer, or a Re metal layer, or a combination thereof.

15. The method of claim 13, wherein the metal-containing cap layer comprises Ru, Co, Mo, W, Pt, Jr, Rh, or Re, and a dopant selected from oxygen, nitrogen, boron, phosphorus, silicon, germanium, or a combination thereof.

16. The method of claim 13, wherein the exposing and irradiating have no temporal overlap.

17. The method of claim 13, wherein the exposing and irradiating have at least partial temporal overlap.

18. A method of forming a semiconductor device, comprising:
providing a patterned substrate containing planarized copper (Cu) metal surfaces and dielectric layer surfaces;
exposing the patterned substrate to a process gas comprising a $Ru_3(CO)_{12}$ precursor to adsorb the $Ru_3(CO)_{12}$ precursor on the Cu metal surfaces and on the dielectric layer surfaces; and
irradiating the Cu metal surfaces and the dielectric layer surfaces on the patterned substrate with electromagnetic radiation to desorb the adsorbed $Ru_3(CO)_{12}$ precursor from the dielectric surfaces, and thereby form a ruthenium-containing cap layer on the Cu metal surfaces but not on the dielectric layer surfaces.

19. The method of claim 18, prior to the exposing, pre-treating the patterned substrate with additional electromagnetic radiation and optionally a cleaning gas.

20. The method of claim 18, wherein the ruthenium-containing cap layer comprises Ru metal, Ru and a dopant selected from oxygen, nitrogen, boron, phosphorus, silicon, germanium, or a combination thereof.

* * * * *

UNITED STATES PATENT AND TRADEMARK OFFICE
CERTIFICATE OF CORRECTION

PATENT NO. : 8,716,132 B2
APPLICATION NO. : 12/371411
DATED : May 6, 2014
INVENTOR(S) : Tadahiro Ishizaka et al.

Page 1 of 1

It is certified that error appears in the above-identified patent and that said Letters Patent is hereby corrected as shown below:

In the Claims

In Claim 14, Column 16, Line 3: delete "Jr" and insert --Ir--.
In Claim 15, Column 16, Line 7: delete "Jr" and insert --Ir--.

Signed and Sealed this
Twenty-third Day of September, 2014

Michelle K. Lee
*Deputy Director of the United States Patent and Trademark Office*